(12) United States Patent
Koyama

(10) Patent No.: US 7,056,774 B2
(45) Date of Patent: *Jun. 6, 2006

(54) METHOD OF MANUFACTURING SEMICONDUCTOR DEVICE

(75) Inventor: Kazuhide Koyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/107,963

(22) Filed: Apr. 15, 2005

(65) Prior Publication Data

US 2005/0202605 A1 Sep. 15, 2005

Related U.S. Application Data

(63) Continuation of application No. 10/391,104, filed on Mar. 18, 2003, now Pat. No. 6,908,820.

(30) Foreign Application Priority Data

Mar. 22, 2002 (JP) ............................. 2002-079942

(51) Int. Cl.
*H01L 21/336* (2006.01)
(52) U.S. Cl. .............................. 438/151; 257/E21.413; 438/305; 438/306
(58) Field of Classification Search ............... 438/151, 438/305, 306; 257/E21.413
See application file for complete search history.

(56) References Cited

U.S. PATENT DOCUMENTS

| | | | |
|---|---|---|---|
| 6,432,754 B1 * | 8/2002 | Assaderaghi et al. | 438/149 |
| 6,445,016 B1 | 9/2002 | An et al. | |
| 6,657,261 B1 * | 12/2003 | Assaderaghi et al. | 257/354 |
| 2005/0077574 A1 * | 4/2005 | Mouli | 257/347 |
| 2005/0128787 A1 * | 6/2005 | Mouli | 365/149 |
| 2005/0151172 A1 * | 7/2005 | Takemura et al. | 257/288 |

* cited by examiner

*Primary Examiner*—George Fourson
(74) *Attorney, Agent, or Firm*—Robert J. Depke; Trexler, Bushnell, Giangiorgi, Blackstone & Marr, Ltd.

(57) ABSTRACT

Disclosed is a method of manufacturing a semiconductor device. A plurality of device separation regions are formed in an SOI layer of an SOI substrate, a desired impurity is implanted into a body portion of an Si active layer region, and therereafter a gate electrode is formed with a gate insulation film therebetween. Thereafter, an impurity is implanted into the Si active layer region to form extension portions of source/drain portions, and then an impurity different in polarity from the impurity in the source/drain portions is halo-implanted to form a reverse-characteristic layer. In the halo implantation, the range of projection is set to reach the inside of a buried oxide film. With this configuration, in a fully depleted SOI-MOSFET or the like provided with a thin film SOI layer, it is made possible to simultaneously achieve an improvement of roll-off characteristic and a reduction in parasitic resistance and to secure a sufficient driving capability.

2 Claims, 10 Drawing Sheets

METHOD OF MANUFACTURING SEMICONDUCTOR DEVICE

The subject matter of application Ser. No. 10/391,104 is incorporated herein by reference. The present application is a continuation of U.S. application Ser. No. 10/391,104, filed Mar. 18, 2003, now U.S. Pat. No. 6,908,820 which claims priority to Japanese Patent Application No. JP2002-079942, filed Mar. 22, 2002. The present application claims priority to the previously filed application.

BACKGROUND OF THE INVENTION

The present invention relates to a method of manufacturing a semiconductor device, and is for contriving a higher degree of integration and a higher performance in an LSI of, for example, a MOS transistor or the like which uses an SOI substrate.

In recent years, in the LSI of the MOS transistor (hereinafter referred to as MOSFET), a higher degree of integration and a higher performance have been demanded, and a structure in which an SOI (silicon on insulator) layer is formed on a semiconductor substrate with a buried oxide layer therebetween, i.e., a MOSFET using an SOI substrate (hereinafter referred to as SOI-MOSFET) has been paid attention to. In the SOI-MOSFET, perfect device separation is achieved by an insulation layer (silicon oxide layer), so that soft errors and latch-up are suppressed, and high reliability can be obtained even in an LSI with a high degree of integration. In addition, since it is possible to reduce junction capacity of a diffusion layer, charging and discharging attendant on switching are suppressed, which is advantageous in view of contriving a higher speed and a lower electric power consumption.

The SOI-MOSFETs as above-mentioned are generally classified into two kinds according to the operation mode. One of the two kinds is a fully depleted SOI-MOSFET with an operation mode in which a depleted layer induced in a body portion beneath the gate electrode reaches the bottom surface of the body portion, i.e., reaches the interface between the body portion and the buried oxide film. The other of the two kinds is a partially depleted SOI-MOSFET with an operation mode in which the depleted layer does not reach the bottom surface of the body portion, and an electrically neutral region remains in the body portion.

FIG. 9 shows a general sectional view of a general fully depleted SOI-MOSFET. In FIG. 9, an SOI substrate 90 provided with an SOI layer 91 on an Si substrate 90a with a buried oxide film 90b therebetween is used, and a plurality of device separation regions 92 are formed on a part on the principal surface side of the SOI substrate 90 at predetermined intervals.

An impurity (impurity for a body portion) for an n-MOS or p-MOS, for example, is implanted into an Si active layer region (SOI layer) 91a located between the device separation regions 92, and a gate electrode 93b is formed on a part of the surface of the Si active layer region 91a (the surface where the body portion is located) with a gate insulation film 93a therebetween.

In addition, an impurity is implanted into the Si active layer region 91a by use of the gate electrode 93b as a mask, whereby extension portions 91b located between the source/drain portions and the body portion (located beneath side walls 93c which will be described later), i.e., the extension portions 91b in the source/drain portions are formed.

Thereafter, the side walls 93c are formed on the side wall sides of the gate electrode 93b. With the side walls 93c as a mask, an impurity is implanted into the source/drain portions of the Si active layer region 91a to form a diffusion layer (a source/drain layer, which is omitted in the figure). Further, a metallic film is built up on the surfaces of the source/drain portions and the surface of the gate electrode 93b, and is thermally treated (annealing treatment) to form a silicide film 94 (and a gate silicide film 93d).

Then, an inter-layer insulation film is formed so as to cover the device separation region 92, the source/drain portions (silicide film 94), the gate electrode 93b (gate silicide film 93d) and the side walls 93c, thereafter contact holes for electrical connection are opened in the portions of the inter-layer insulation film where the source/drain portions (silicide film 94) are located, and a wiring is formed so as to fill up the contact holes, thereby manufacturing a fully depleted SOI-MOSFET. In FIG. 9, symbol 93e denotes a diffusion layer formed on the gate electrode 93b, together with the extension portions 91b, and the inter-layer insulation film, the contact holes and the wiring are omitted in the figure.

In the case of the fully depleted SOI-MOSFET as above-mentioned, in order that an electrically neutral region in the body portion does not remain, a very thin SOI layer must be formed on the oxide film (namely, the buried oxide film) in a uniform thickness, so that the difficulty on the basis of the manufacturing process is increased; however, there is obtained a great merit that the sub-threshold characteristic (S characteristic) among operation characteristics is improved.

Incidentally, in the fully depleted SOI-MOSFET, since the thickness of the depleted layer in the body portion is restricted by the buried oxide film, the depleted electric charge amount is largely reduced as compared with the partially depleted type, and, in place, movable electric charges contributing to the drain current are increased. As a result, a steep S characteristic is obtained, and, in the case of forming a fully depleted SOI-MOSFET in the 0.13 ,,m generation and later generations, for example, the thickness of the SOI layer must be suppressed to be about 30 nm or less.

Namely, according to the fully depleted SOI-MOSFET, even where a very steep S characteristic is obtained, the threshold voltage can be lowered while suppressing the off-leak current, so that a sufficient drain current can be secured even at a low operating voltage, and a device with an extremely low power consumption such as to be capable of operating at a voltage of 1 V or less (and a threshold voltage of 0.3 V or less), for example, can be produced.

Therefore, in the case of manufacturing an LSI of a super-low power consumption device with high degree of integration and high performance in the future, it is important to establish a process which makes it possible to constitute a fully depleted SOI-MOSFET for a very thin (for example, 30 nm or less in thickness) SOI layer.

In the case where the SOI layer is a thin film as above-mentioned, according to the general technology for manufacturing the fully depleted SOI-MOSFET, the body portion in the SOI layer would be thinned, and the source/drain portions and the extension portions would also be thinned. As a result, the sheet resistance in the source/drain portions and the extension portions is raised, i.e., the parasitic resistance of the transistor is raised, thereby lowering the driving capability.

The sheet resistance of the source/drain portions can be sufficiently reduced by forming a silicide film as shown in FIG. 9, but, as for the sheet resistance of the extension portions, it is necessary to raise the impurity concentration (for example, to about $1 \times 10^{15}/cm^2$) in the extension portions. When the impurity concentration in the extension portions is raised, however, the extension portion on the source side would be heavily influenced by the electric field (electric line of force) imposed from the drain side, and, particularly in the case where the transistor constituted has a small gate length, the threshold voltage (absolute value of the threshold voltage) is steeply lowered (roll-off characteristic is worsened).

As a method of improving the roll-off characteristic, there is known a method in which, as for example indicated by void arrows in a general illustration in FIG. 10 (the same components as those in FIG. 9 are denoted by the same symbols as above, and description thereof is omitted), after the formation of the extension portions 91*b* an impurity different in polarity from the impurity in the source/drain portions is halo-implanted (halo ion implantation) to thereby form an impurity layer (hereinafter referred to as reverse-characteristic layer) 95 different from the source/drain layer in electrical characteristics so as to cover the surroundings of the extension portions (the lower surface side of the source/drain portions, the lower surface side of the extension portions, and the gate electrode side), thereby shielding the influence of the electric field from the drain side.

The general halo implantation is carried out, for example, by a method in which the arrangement angle of an SOI substrate arranged in an ion implantation apparatus is adjusted so that ions are obliquely implanted at an implantation angle relative to the direction of a normal to the implanted surface (the surface of the Si active layer region, in an embodiment which will be described later) of more than 7°.

However, in the case where the reverse-characteristic layer is formed on the lower surface side (the buried oxide film side) of the extension portions as shown in FIG. 10, particularly in a fully depleted SOI-MOSFET in which p-MOS is formed, there is the problem that the sheet resistance of the extension portions is raised.

Due to the foregoing, in the fully depleted SOI-MOSFET in which a thin film SOI layer is formed, it is impossible to simultaneously achieve an improvement of roll-off characteristic and a reduction in parasitic resistance, and, therefore, it has been impossible to secure a sufficient driving capability.

SUMMARY OF THE INVENTION

The present invention has been made based on the above-mentioned problems. Accordingly, it is an object of the present invention to provide a method of manufacturing a semiconductor device in which a halo implantation suited particularly to a fully depleted SOI-MOSFET provided with a thin film SOI layer is carried out to make it possible to simultaneously achieve an improvement of roll-off characteristic and a reduction in parasitic resistance and to secure a sufficient driving capability.

In order to attain the above object, according to the present invention, there is provided a method of manufacturing a semiconductor device, using an SOI substrate provided with an SOI layer on an Si subsrate with a buried oxide film therebetween, forming a plurality of device separation regions in the SOI layer, and implanting an impurity into an Si active layer region between the device separation regions to form a body portion and source/drain portions so as thereby to constitute a MOSFET, the method comprising the steps of: forming a gate electrode on the body portion of the Si active layer region with a gate insulation film therebetween, implanting an impurity into the Si active layer region to form extension portions of the source/drain portions, and halo-implanting an impurity different in polarity from the impurity in the source/drain portions into the Si active layer region to form a reverse-characteristic layer. In the method, the range of projection of the halo implantation is so set as to reach the inside of the buried oxide film.

According to the present invention, the impurity for the reverse-characteristic layer can be introduced, in a sufficient concentration, into the body portion side of the extension portions. Namely, since the impurity for the reverse-characteristic layer is scarcely introduced into the extension portions, it is possible to simultaneously achieve suppression of a rise in parasitic resistance (suppression of a rise in sheet resistance in the extension portions) and an improvement of roll-off characteristic, and to secure a sufficient driving capability.

In the halo implantation, the implantation angle may be such that the implanted impurity is implanted to the body portion side of the extension portions in the Si active layer region without being interfered by device separation regions adjacent to the Si active layer region surface (the implanted surface), the gate electrode, or the like (preferably, an angle of more than 7°).

In addition, the present invention promises a conspicuous effect of improving the driving capability, in a semiconductor device in which the Si active layer region is so formed that a depleted layer induced at the body portion reaches the interface between the SOI layer and the buried oxide film in the SOI substrate.

Examples of the SOI substrate in the present invention include various semiconductor substrates comprising a buried insulation layer therein, such as Si, Si—Ge, etc. Examples of the materials for forming the gate insulation film include insulating materials of Si compounds such as $SiO_2$, SiN, SiON, SiOF, etc.; high dielectric constant films such as $Ta_2O_5$; and laminate films composed of a combination of more than one of the insulating materials and the high dielectric constant films.

Examples of the gate electrode material in the present invention include polycrystalline silicon (or amorphous silicon) containing an impurity such as B, As, P, etc.; high melting point metals such as W, Mo, Ta, Ti, etc.; metallic silicides such as $WSi_2$, $MoSi_2$, $TiSi_2$, $CoSi_2$, NiSi, etc.; metallic nitrides such as WN, TaN, TiN, etc.; and laminate films composed of a combination of more than one of the polycrystalline silicon, the high melting point metals, the metallic silicides, and the metallic nitrides.

Examples of the impurity to be introduced into the Si active layer region in the present invention include various Group 3A and Group 5A materials such as B, In, P, As, Sb, etc. Examples of the material for forming the side walls include insulating materials of Si compounds such as $SiO_2$, SiN, SiON, SiOF, etc.; polycrystalline silicon (or amorphous silicon); and laminate films composed of a combination of more than one of the insulating materials and polycrystalline silicon.

Examples of the material for the silicide film formed in the Si active layer region in the present invention include various materials such as $TiSi_2$, $CoSi_2$, NiSi, $WSi_2$, $MoSi_2$, etc.

According to the present invention, implantation energy and implantation angle are so adjusted that the range of projection in halo implantation reaches the buried oxide film of the SOI substrate, thereby forming the reverse-characteristic layer. By this, even in the case of a fully depleted SOI-MOSFET in which, for example, the SOI layer in the form of a thin film (for example, a thin film such that the depleted layer induced at the body portion reaches the interface between the SOI layer and the buried oxide film in the SOI substrate) is formed, it is possible to simultaneously achieve an improvement of roll-off characteristic and a reduction in parasitic resistance, and thereby to obtain an LSI with high speed and low power consumption which securely displays a sufficient driving capability.

The above and other objects, features and advantages of the present invention will become apparent from the following description and appended claims, taken in conjunction with the accompanying drawings which show by way of example some preferred embodiments of the invention.

DESCRIPTION OF THE PREFERRED EMBODIMENTS

Now, a semiconductor device and a method of manufacturing the same according to one embodiment of the present invention will be described below.

In the present embodiment, an SOI substrate in which an SOI layer in the form of a thin film (a thin film such that a depleted layer inducted at a body portion reaches the interface between the SOI layer and a buried oxide film in the SOI substrate) is formed on an Si substrate with an oxide film (a thicker oxide film) therebetween is used, and a plurality of device separation regions are formed at a part of the principal surface side of the SOI substrate at predetermined intervals by, for example, an STI (shallow trench isolation) method. An impurity for n-MOS or p-MOS is implanted into an Si active layer region (SOI layer) located between the device separation regions, and a gate electrode is formed on a part of the surface thereof (the part where the body portion is located) with a gate insulation film therebetween.

An impurity at a comparatively high concentration is implanted into source/drain portions and extension portions of the Si active layer region by using the gate electrode as a mask, to form the extension portions. Thereafter, halo implantation is carried out while adjusting implantation energy and implantation angle so that the range of projection (Rp) reaches the inside of the buried oxide film, thereby forming a reverse-characteristic layer on the body portion side of the extension portions in the Si active layer region.

In addition, after formation of side walls on the side wall sides of the gate electrode, an impurity is implanted by use of the side walls as a mask to thereby form a source/drain layer, thereafter a metallic film is built up on the surfaces of the source/drain portions, and a heat treatment (annealing treatment) is conducted to form a silicide film.

Then, an inter-layer insulation film is formed so as to cover the device separation regions, the source/drain portions (silicide film), the gate electrode and the side walls, and contact holes for electrical connection are opened at the positions of the source/drain portions (silicide film) and the gate electrode in the inter-layer insulation film.

As mentioned above, the reverse-characteristic layer is formed not by simply conducting halo implantation but by conducting halo implantation while adjusting the implantation energy and implantation angle so that the range of projection (Rp) reaches the inside of the buried oxide film, whereby the reverse-characteristic layer is not formed at the extension portions, so that a rise in the sheet resistance in the extension portions can be suppressed. Besides, since the reverse-characteristic layer is formed on the body portion side of the extension portions in the Si active layer region, roll-off characteristic can be improved.

EXAMPLE

Figure 1:
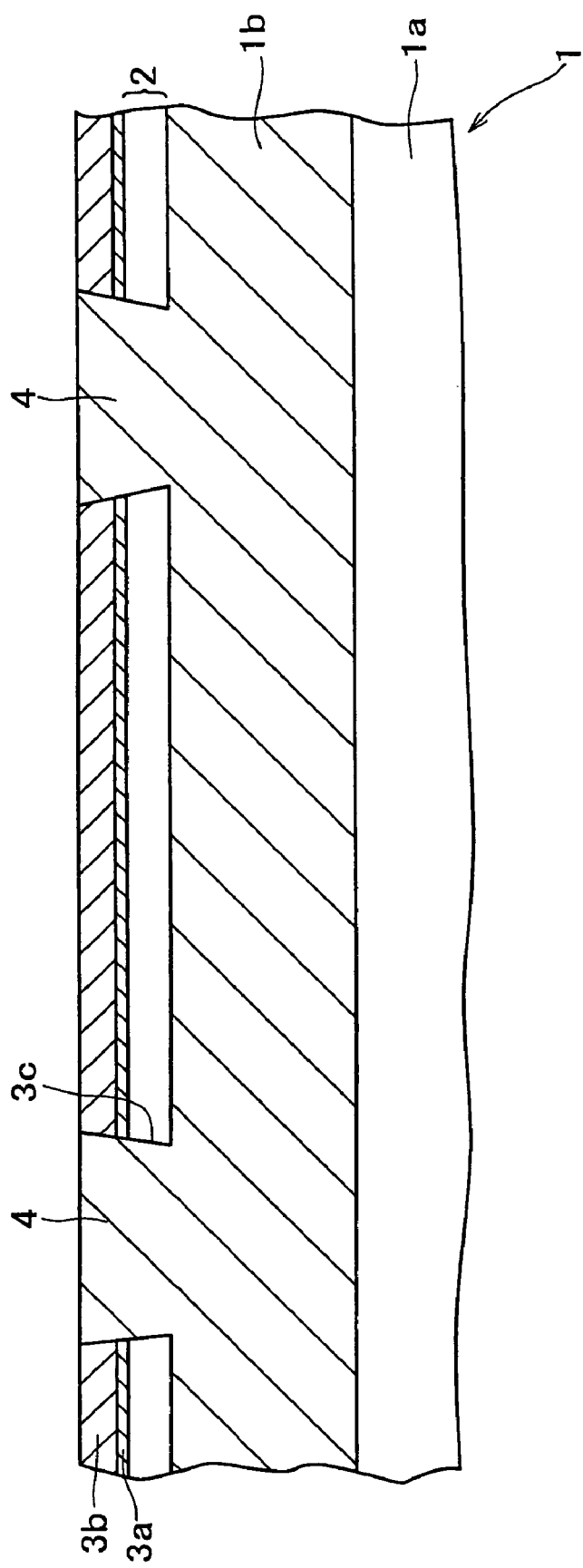
FIG. 1 is a manufacturing step chart (formation of device separation regions) of a semiconductor device according to one embodiment of the present invention.

An example of the method of manufacturing a semiconductor device (SOI-MOSFET) according to the present embodiment will be described in detail below, based on the drawings (which show respective manufacturing steps). First, in FIG. 1, an SOI substrate 1 in which an SOI layer 2 in the form of a thin film (for example, 33 nm in thickness) is formed on an Si substrate 1a with a comparatively thick buried oxide film (for example, an oxide film of 100 nm in thickness) 1b therebetween was used, a thermal oxide film 3a (for example, 10 nm in thickness) was formed on the surface of the SOI layer 2 (upon this formation, the thickness of the SOI layer becomes about 29 nm), and thereafter an $Si_3N_4$ film 3b (for example, 100 nm in thickness) as a protective film for CMP (chemical mechanical polish) was formed on the surface of the thermal oxide film 3a by a low pressure CVD (low pressure chemical vapor deposition) method.

Then, only the portions of the $Si_3N_4$ film 3b where the device separation regions (described later) are located were removed by desired lithography and etching, and thereafter etching was conducted through the portions thus removed, to form trench grooves 3c in the SOI layer 2 (and the thermal oxide film 3a). In this example, the formation and etching of the $Si_3N_4$ film 3b and the etching of the SOI layer 2 were conducted under the following conditions.

[Film formation conditions for $Si_3N_4$ film 3b]
Gas used: $SiH_2Cl_2/NH_3/N_2$=50/200/200 sccm
Pressure: 70 Pa
Heated substrate temperature: 760° C.

[Etching conditions for $Si_3N_4$ film 3b]
Gas used: $CF_4/Ar$=100/900 sccm

Pressure: 105 Pa
Heated substrate temperature: 10° C.
RF power: 600 W

[Etching conditions for SOI layer 2]
Gas used: $C_4F_8/O_2/Ar=5/4/100$ sccm
Pressure: 5.3 Pa
Heated substrate temperature: 10° C.
RF power: 400 W Then, the inside walls of the trench grooves 3c were oxidized (for example, 5 nm in thickness; omitted in the figure), and thereafter an $SiO_2$ film was formed (for example, 300 nm in thickness) so as to fill up the trench grooves 3c by a low pressure CVD method, an annealing treatment was conducted, and the $SiO_2$ film at other portions than the trench grooves 3c was removed by a CMP method, whereby a plurality of device separation regions 4 were formed at predetermined intervals. In this example, the formation of the $SiO_2$ film, the annealing treatment thereof, and the CMP thereof for the device separation regions 4 were conducted under the following conditions.

[Film formation conditions for $SiO_2$]
Gas used: $SiH_4/O_2/N_2=250/250/100$ sccm
Pressure: 13.3 Pa
Heated substrate temperature: 520° C.

[Annealing treatment conditions for $SiO_2$]
Annealing temperature: 1000° C.
Annealing time: 30 min

[CMP conditions for $SiO_2$]
Polishing pressure: 300 g/cm$^2$
Revolution number: surface plate 30 rpm; polishing head 30 rpm
Polishing pad used: IC-1000 (trade name)
Slurry used: $NH_4OH$-based slurry (containing fumed silica)
Slurry flow rate: 100 cc/min
Temperature of slurry used: 25–30° C.

Figure 2:
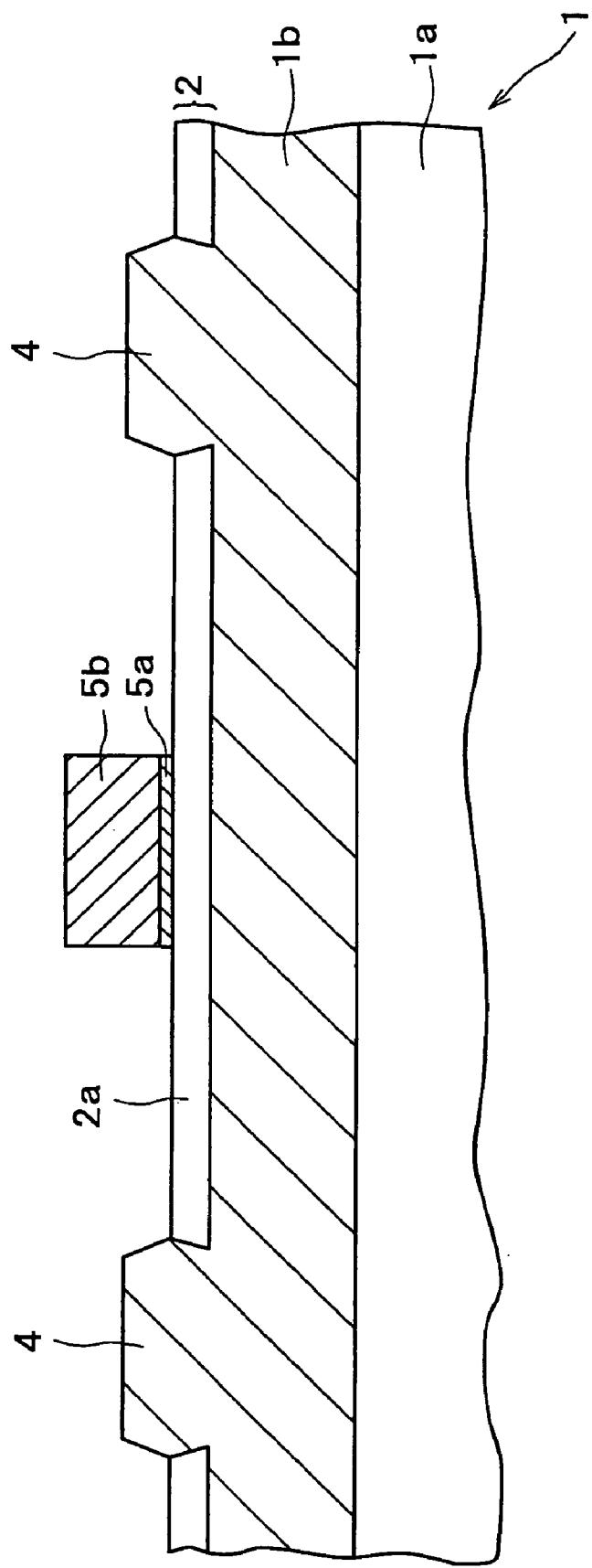
FIG. 2 is a manufacturing step chart (formation of a gate electrode) of the semiconductor device according to the present embodiment.

Next, in FIG. 2, the remaining $Si_3N_4$ film 3b was removed by a wet treatment using hot phosphoric acid, and an impurity for n-MOS or p-MOS (an impurity for the body portion) was implanted into the SOI layer 2 between the device separation regions 4, i.e., the Si active layer region 2a. In this example, the implantation of the impurity for the n-MOS or the p-MOS was conducted under the following conditions. Incidentally, the implantation angle shown below represents the angle of the direction of ion implantation (and the halo implantation which will be described later) relative to the direction of a normal to the surface of the Si active layer region 2a.

[Implantation conditions in the case of n-MOS]
Impurity: $BF^{2+}$
Implantation energy: 20 keV
Dose: $3 \times 10^{12}/cm^2$
Implantation angle: 7°

[Implantation conditions in the case of p-MOS]
Impurity: $P^+$
Implantation energy: 10 keV
Dose: $3 \times 10^{12}/cm^2$
Implantation angle: 7°

Thereafter, the thermal oxide film 3a was removed, an insulation film and polysilicon (polysilicon by a low pressure CVD method) were sequentially formed (for example, respectively 1.8 nm and 150 nm in thickness) on the surface of the Si active layer region 2a, and the polysilicon and the insulation film were processed into desired patterns by etching, to form a gate insulation film 5a and a gate electrode 5b. In this example, the formation and etching of the polysilicon were conducted under the following conditions.

[Film formation conditions for polysilicon]
Gas used: $SiH_4/N_2/He=100/200/400$ sccm
Pressure: 70 Pa
Heated substrate temperature: 610° C.

Figure 3:
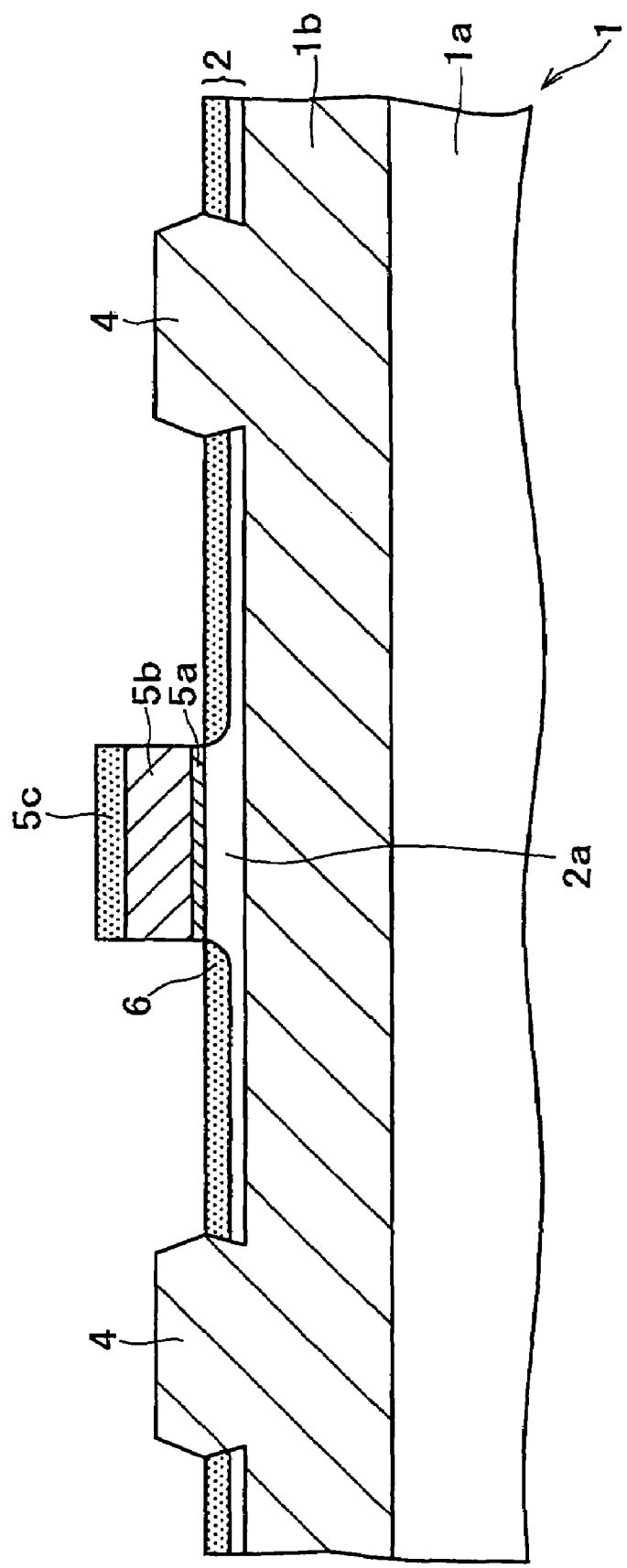
FIG. 3 is a manufacturing step chart (formation of extension portions) of the semiconductor device according to the present embodiment.

[Etching conditions for polysilicon]
Gas used: $C_2Cl_3F_3/SF_6=60/10$ sccm
Pressure: 1.3 Pa
Heated substrate temperature: 20° C.
RF power: 150 W Next, as shown in FIG. 3, an impurity was implanted into the Si active layer region 2a (the source/drain portions and the extension portions) by using the gate electrode 5b as a mask, to form the extension portions 6. In FIG. 3, symbol 5c denotes a diffusion layer formed on the surface of the gate electrode 5b by the impurity used for formation of the extension portions 6.

At the time of implanting the impurity for forming the extension portions 6 as described above, it is necessary to set the concentration (dose) of the impurity to be high (set to such a level that the parasitic resistance of the transistor can be lowered and a sufficient driving capability of the transistor can be secured) in order to sufficiently reduce the sheet resistance of the extension portions 6. In this example, the implantation of the impurity for forming the extension portions 6 was carried out under the following conditions.

[Implantation conditions in the case of n-MOS]
Impurity: $As^+$
Implantation energy: 2.5 keV
Dose: $1 \times 10^{15}/cm^2$
Implantation angle: 0°

[Implantation conditions in the case of p-MOS]
Impurity: $BF^{2+}$
Implantation energy: 2.5 keV
Dose: $8 \times 10^{14}/cm^2$
Implantation angle: 0°

Figure 4:
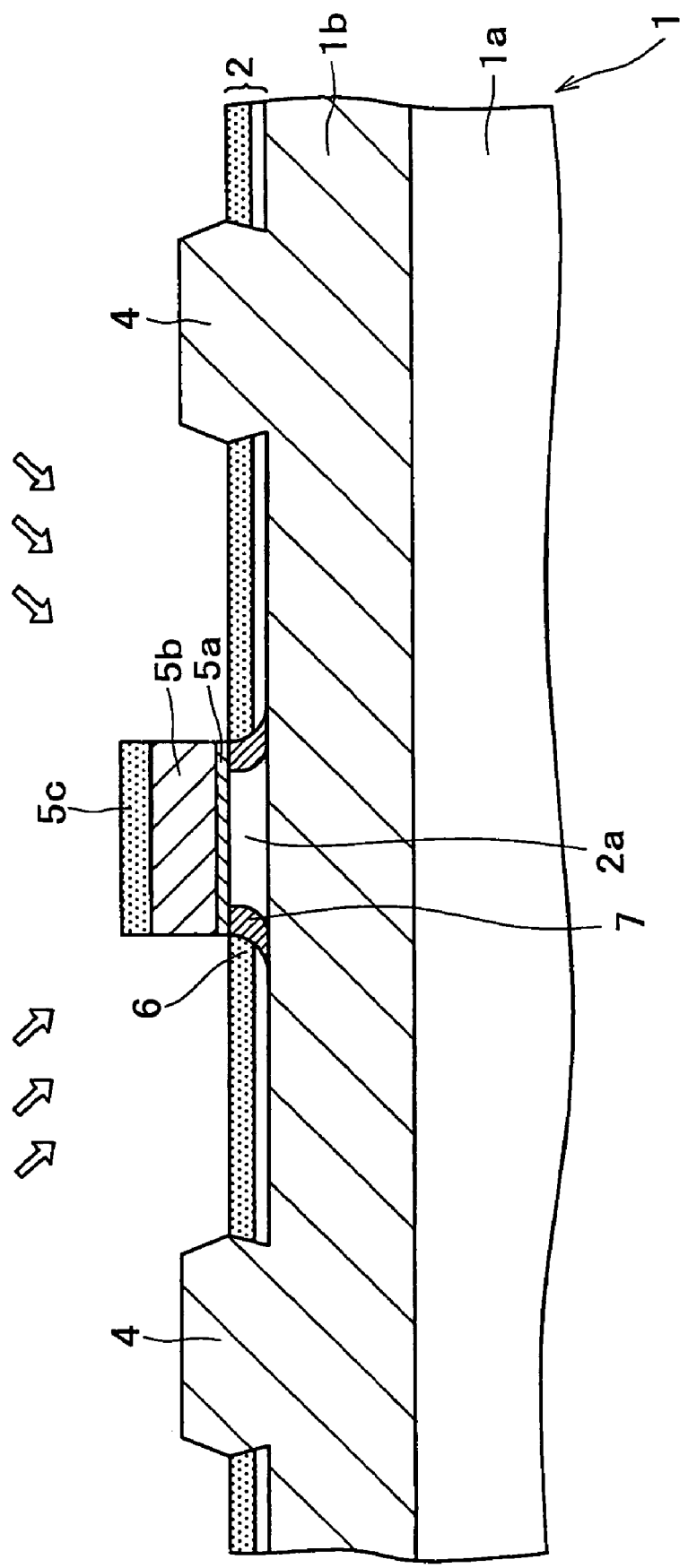
FIG. 4 is a manufacturing step chart (formation of a reverse-characteristic layer) of the semiconductor device according to the present embodiment.

Next, as shown in FIG. 4, an impurity different in polarity from the impurity for a source/drain layer which will be described later was halo-implanted so that the range of projection (Rp) reaches the inside of the buried oxide film by use of the gate electrode 5b as a mask, to form a reverse-characteristic layer 7 on the body portion side of the extension portions 6 in the Si active layer region 2. After the formation of the reverse-characteristic layer 7 as above-mentioned, a short time heat treatment (RTA: rapid thermal anneal) may be conducted in order to prevent increased-speed diffusion due to defects. Besides, the halo implantation is carried out divisionally in a plurality of times while adjusting the arrangement angle of the SOI substrate 1 arranged in, for example, a halo implantation apparatus (the angle of the surface of the SOI layer relative to the ion implantation direction) according to the arrangement (pattern) of the gate electrodes 5b relative to the SOI substrate 1. In this example, the implantation of the impurity (divisional implantation in eight times) and the RTA for the reverse-characteristic layer 7 were conducted under the following conditions.

[Implantation conditions in the case of n-MOS]
Impurity: $B^+$
Implantation energy: 12 keV Dose: $(1\times10^{13}/cm^2)\times8$ times
Implantation angle: 28°
Range of projection: 37 nm

[Implantation conditions in the case of p-MOS]
Impurity: P+
Implantation energy: 25 keV
Dose: $(1.4\times10^{13}/cm^2)\times8$ times
Implantation angle: 28°
Range of projection: 31 nm

Figure 5:
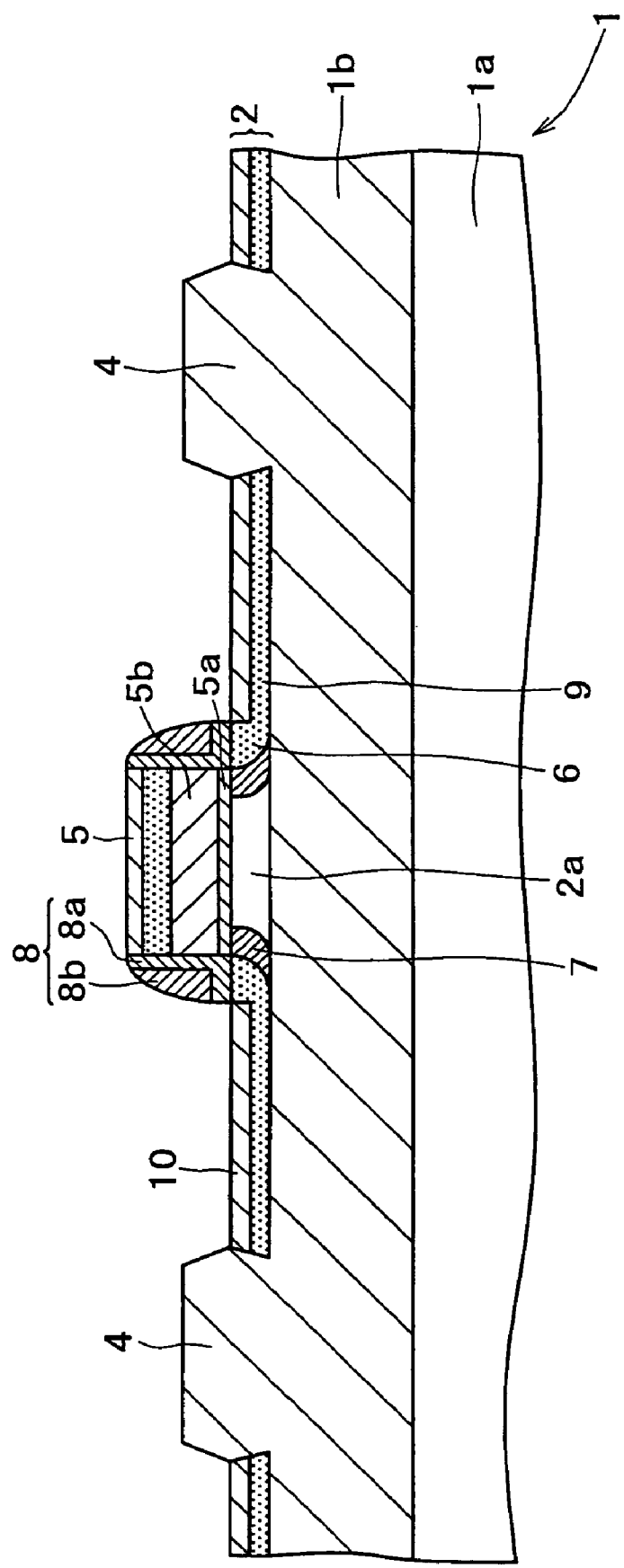
FIG. 5 is a manufacturing step chart (formation of a source/drain layer and a silicide layer) of the semiconductor device according to the present embodiment.

[RTA conditions for reverse-characteristic layer 7]
Annealing temperature: 950° C.
Annealing time: 10 sec
Atmosphere used: in $N_2$ atmosphere Next, in FIG. 5, first an $SiO_2$ film 8a (for example, 10 nm in thickness) and an $Si_3N_4$ film 8b (for example, 50 nm in thickness) were sequentially formed so as to cover the gate electrode 5b, and the $Si_3N_4$ film 8b and the $SiO_2$ film 8a were processed into desired patterns by etching, to form side walls 8. In this example, the formation of the $SiO_2$ film 8a and the formation of the $Si_3N_4$ film 8b were conducted under the same conditions as those for the formation of the $SiO_2$ film and the formation of the $Si_3N_4$ film 3b in the device separation regions 4 described above.

Thereafter, with the side walls 8 as a mask, an impurity was implanted into the Si active layer region 3a (source/drain portions) to a depth larger (for example, a little larger) than the impurity in the extension portions 6, to form a source/drain layer 9. As a result, the extension portions 6 remain only at the portions located beneath the side walls 8. In this example, RTA was conducted for activating the source/drain layer 9. Besides, the implantation of the impurity into the source/drain layer 9 and the RTA were conducted under the following conditions. Generally, in the case of forming a source/drain layer by an implantation energy not less than 5 keV, the implantation angle is set at about 7° in order to prevent channeling.

[Implantation conditions in the case of n-MOS]
Impurity: P+
Implantation energy: 15 keV
Dose: $(2\times10^{15}/cm^2)\times4$ times
Implantation angle: 7°

[Implantation conditions in the case of p-MOS]
Impurity: B+
Implantation energy: 5 keV
Dose: $(1\times10^{15}/cm^2)\times4$ times
Implantation angle: 7°

[RTA conditions for source/drain layer 9]
Annealing temperature: 950° C.
Annealing time: 10 sec
Atmosphere used: in $N_2$ atmosphere Then, a thin film of Co (for example, 5 nm in thickness) was formed so as to cover the surfaces of the source/drain portions (source/drain layer 9) in the Si active layer region 2a and the gate electrode 5b by sputtering, and the surfaces of the source/drain portions in the Co film (and the surface of the gate electrode 5b) were silicidized by RTA, to form a silicide film 10 (and a gate silicide film 5d) composed of CoSi.

Thereafter, the Co film at portions other than the surfaces of the source/drain portions (and the surface of the gate electrode 5b) (namely, the Co film located on the surfaces of the side walls 8 and the device separation regions 4) was removed by an aqueous sulfuric acid solution. In this example, the formation of the silicide film 10 (and the gate silicide film 5d) and the RTA were conducted under the following conditions.

[Film formation conditions for the silicide film 10]
Gas used: Ar=100 sccm
Pressure: 0.4 Pa
Heated substrate temperature: 450° C.
DC power: 0.8 kW

[RTA conditions for the silicide film 10]
Annealing temperature: 550° C.
Annealing time: 30 sec
Atmosphere used: in $N_2$ or $N_2$/Ar atmosphere Furthermore, the silicide film 10 formed as above-mentioned was subjected again to RTA (hereinafter referred to as re-RTA), and the CoSi film was further brought into reaction with the Si layer of the Si active layer region to convert it into a $CoSi_2$ film, whereby the resistance of the silicide film 10 was sufficiently lowered. In this example, the re-RTA was conducted under the following conditions.

[Re-RTA conditions]
Annealing temperature: 700° C.
Annealing time: 30 sec
Atmosphere used: in $N_2$ or $N_2$/Ar atmosphere Incidentally, it has been found that the thickness of the Si layer consumed at the time of forming the $CoSi_2$ film by silicidization is about 3.64 times that of the Co film formed by sputtering, and the thickness of the $CoSi_2$ film obtained is about 3.52 times that of the Co film. Therefore, when the SOI layer 2 having a thickness of 29 nm is used and the Co film having a thickness of 5 nm is formed in the silicide film 10 as in the present example, a $CoSi_2$ film having a thickness of about 18 nm is formed, so that an Si layer having a thickness of about 11 nm is left at the portion located beneath the $CoSi_2$ film.

Figure 6:
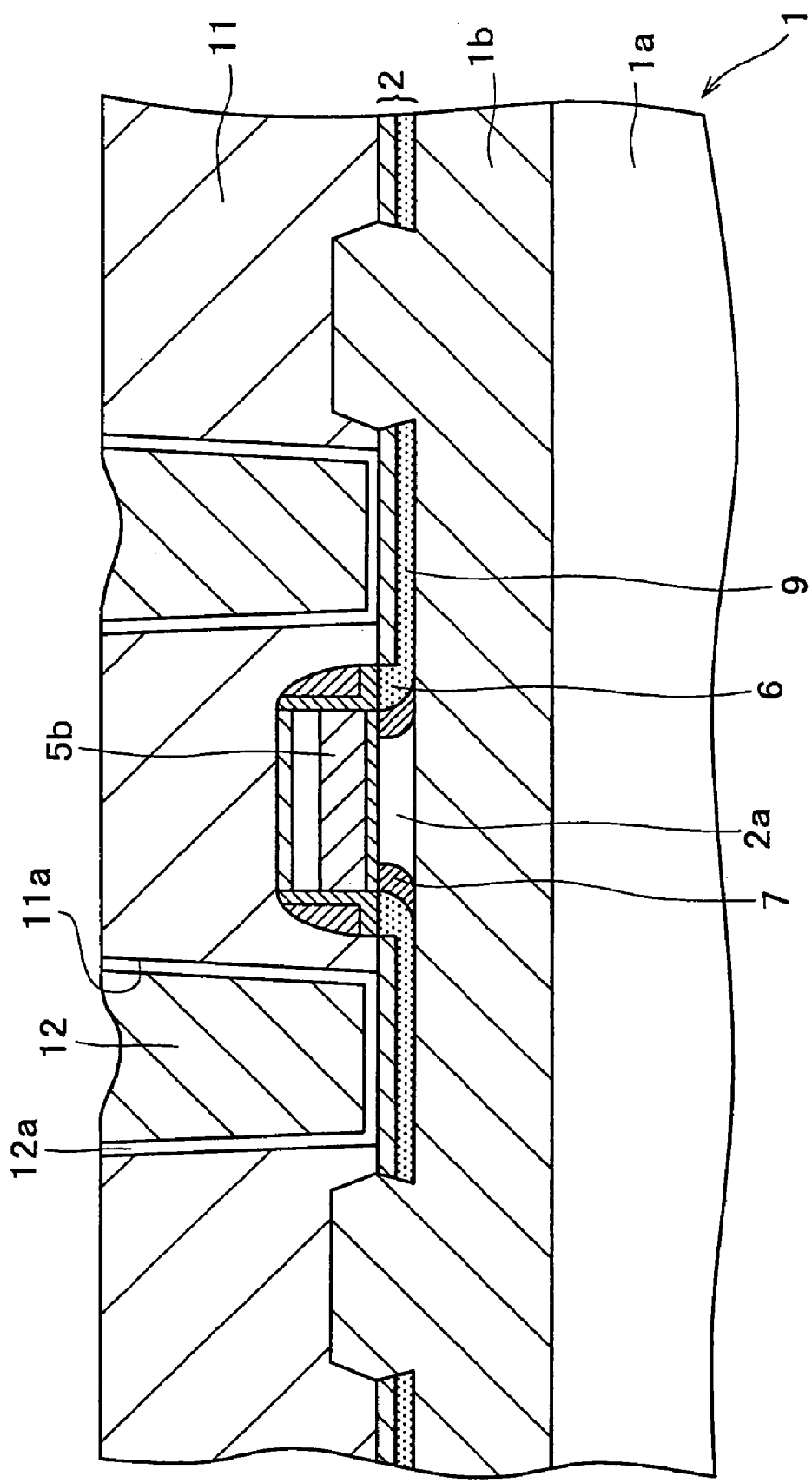
FIG. 6 is a manufacturing step chart (formation of a contact plug) of the semiconductor device according to the present embodiment.

Next, as shown in FIG. 6, for example an $SiO_2$ film was built up so as to cover the surfaces of the source/drain portions of the Si active layer region 2a and the surfaces of the device separation regions 4, the gate silicide film 5d and the side walls 8 in the SOI substrate 1 by a low pressure CVD method to form an inter-layer insulation film 11 (for example, 700 nm in thickness), and thereafter contact holes 11a for electrical connection were opened on the upper side of the silicide film 10 in the inter-layer insulation film 11 by desired lithography and etching. In this example, the etching for opening the contact holes 11a was conducted under the following conditions.

[Etching conditions for contact holes 11a]
Gas used: $C_4F_8$/CO/Ar=10/100/200 sccm
Pressure: 6 Pa
Heated substrate temperature: 20° C.
RF power: 1600 W Thereafter, a Ti film (for example, 20 nm in thickness) and a TiN film (for example, 30 nm in thickness) were sequentially formed on the surfaces of the inside walls (and the bottom portions) of the contact holes 11a by sputtering, to form barrier metals 12a. Furthermore, a W film was formed so as to fill up the contact holes 11a by a CVD method, and the W film at portions other than the contact holes 11a was etched back, to form contact plugs 12 (and desired wiring or the like), whereby a semiconductor device was manufactured. In this example, the formation of the barrier metals 12a (the Ti film and the TiN film) and the formation and etching of the contact plugs 12 (the W film) were carried out under the following conditions.

[Film formation conditions for Ti film]
Gas used: Ar=100 sccm
Pressure: 0.4 Pa
Heated substrate temperature: 200° C.
DC power: 6 kW

[Film formation conditions for TiN film]
Gas used: Ar/$N_2$=20/70 sccm
Pressure: 0.4 Pa
Heated substrate temperature: 200° C.
Microwave: 12 kW

[Film formation conditions for W film]
Gas used: $WF_6$/$H_2$/Ar=80/500/2800 sccm
Pressure: 10640 Pa
Heated substrate temperature: 400° C.

[Etch-back conditions for W film]
Gas used: $SF_6$/Ar=110/90 sccm
Pressure: 35 Pa
RF power: 275 W In the semiconductor device of the p-MOS manufactured by the example described above, the sheet resistance of the extension portions when the halo implantation energy was varied was measured, and the results are shown in the characteristic diagram of FIG. 7. Besides, in the semiconductor device of the p-MOS, the threshold voltage when the semiconductor device was manufactured by setting the halo implantation energy at 15 keV (the range of projection reaching the inside of the Si active layer region) and 25 keV (the range of projection reaching the inside of the buried oxide film) and by varying the gate length was measured, and the results are shown in the characteristic diagram of FIG. 8.

Figure 7:
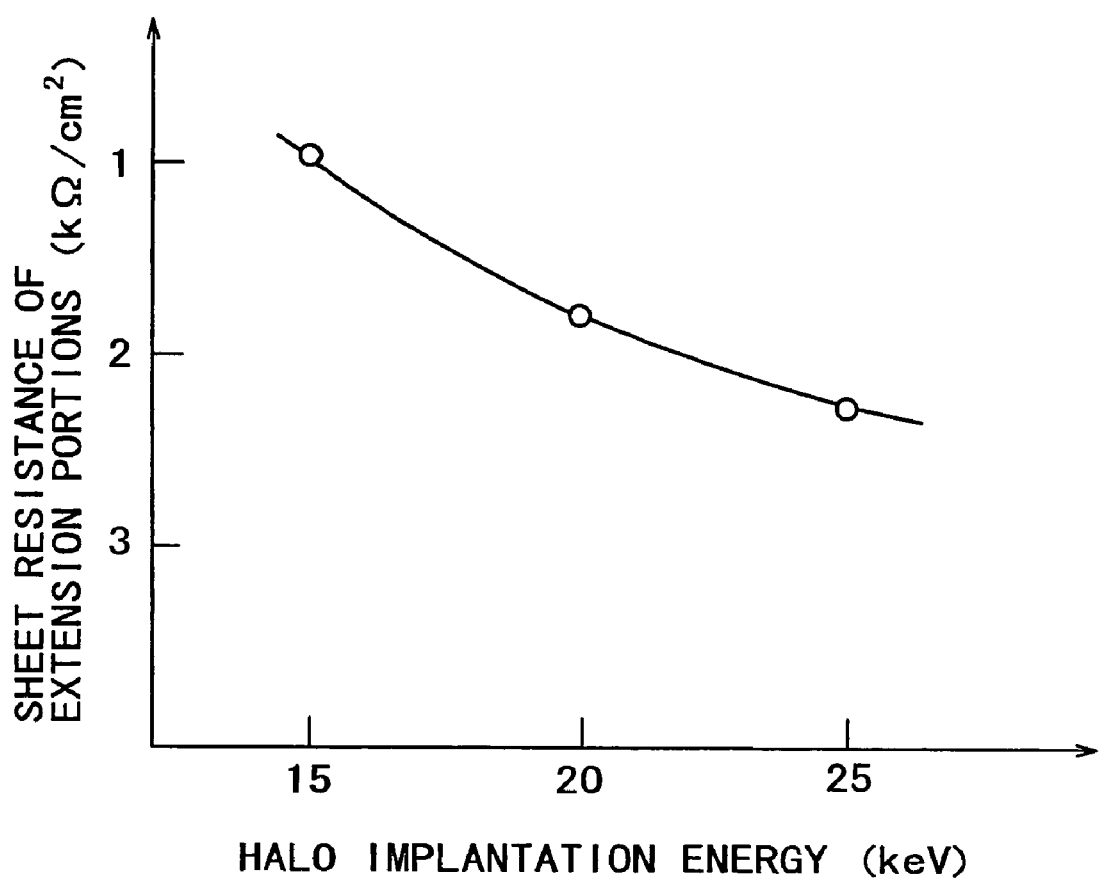
FIG. 7 is a sheet resistance characteristic diagram of the extension portions relative to halo implantation energy in the present embodiment.
Figure 8:
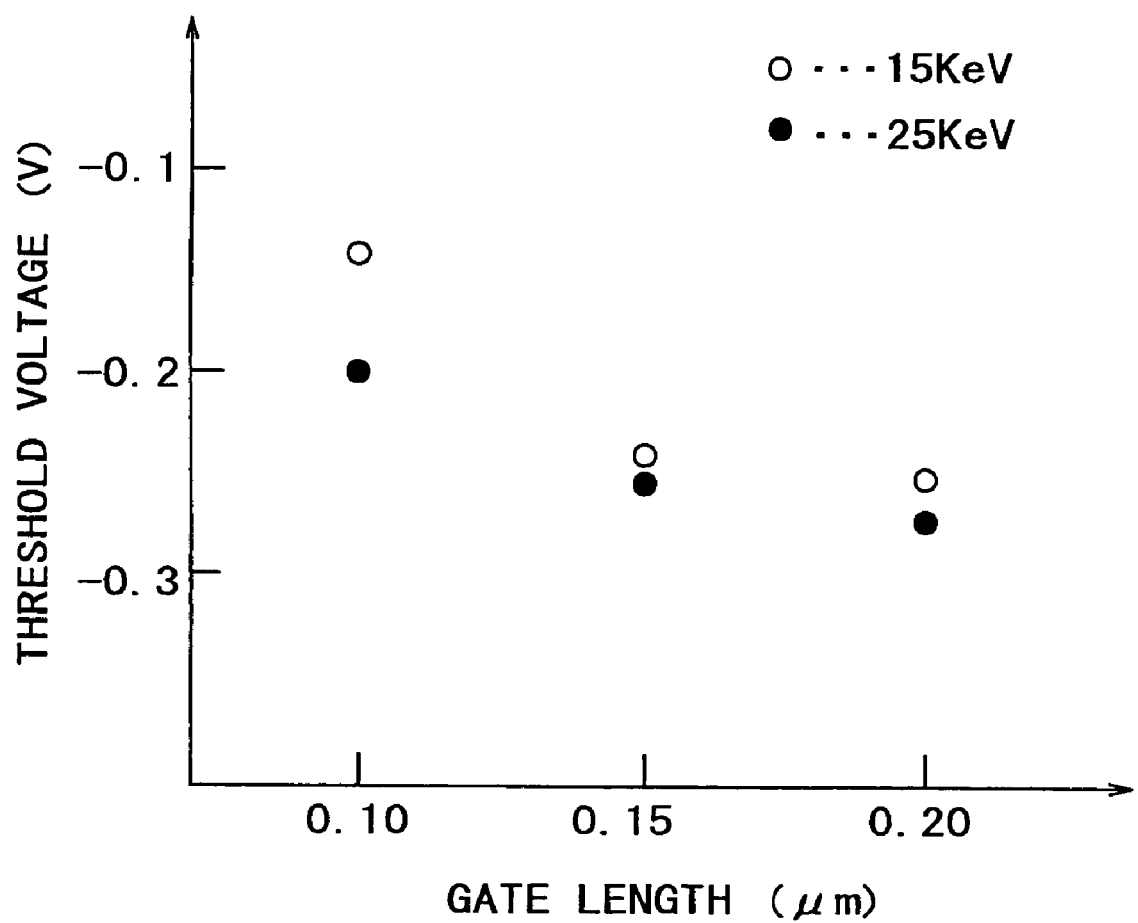
FIG. 8 is a threshold voltage characteristic diagram relative to gate length in the present embodiment.
Figure 9:
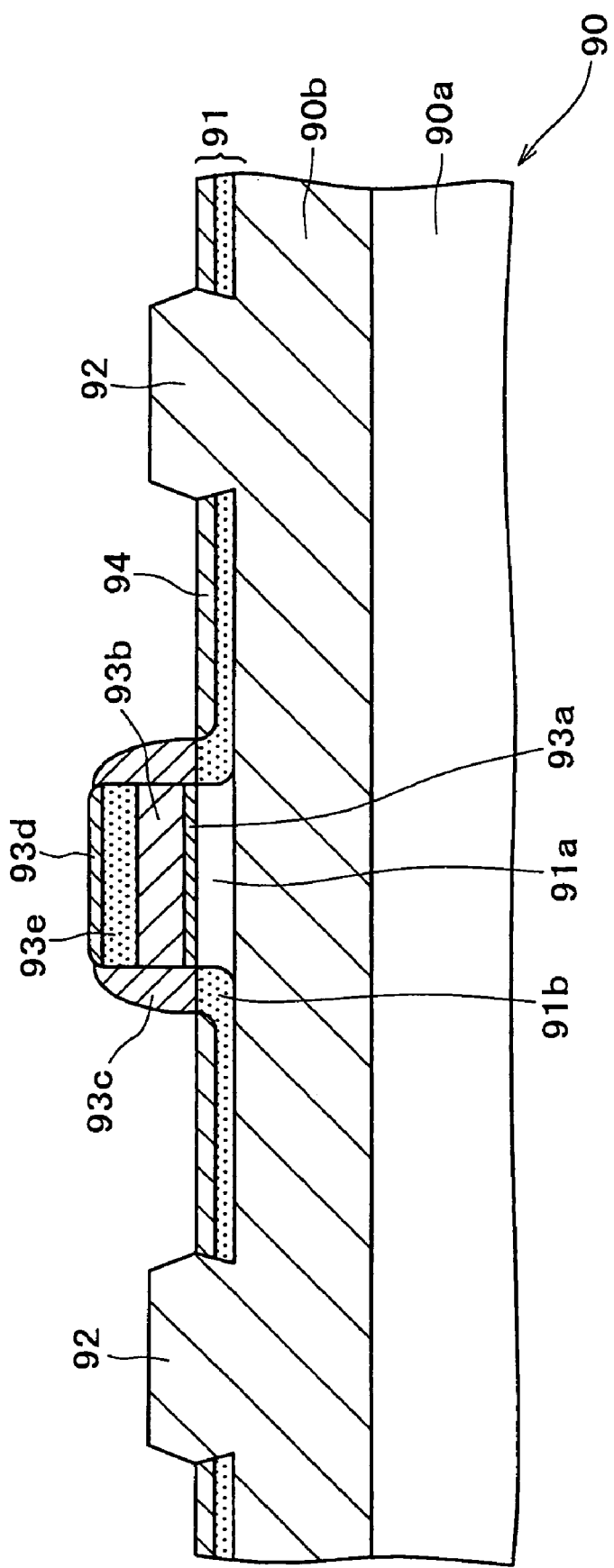
FIG. 9 is a general sectional view of a general fully depleted SOI-MOSFET.
Figure 10:
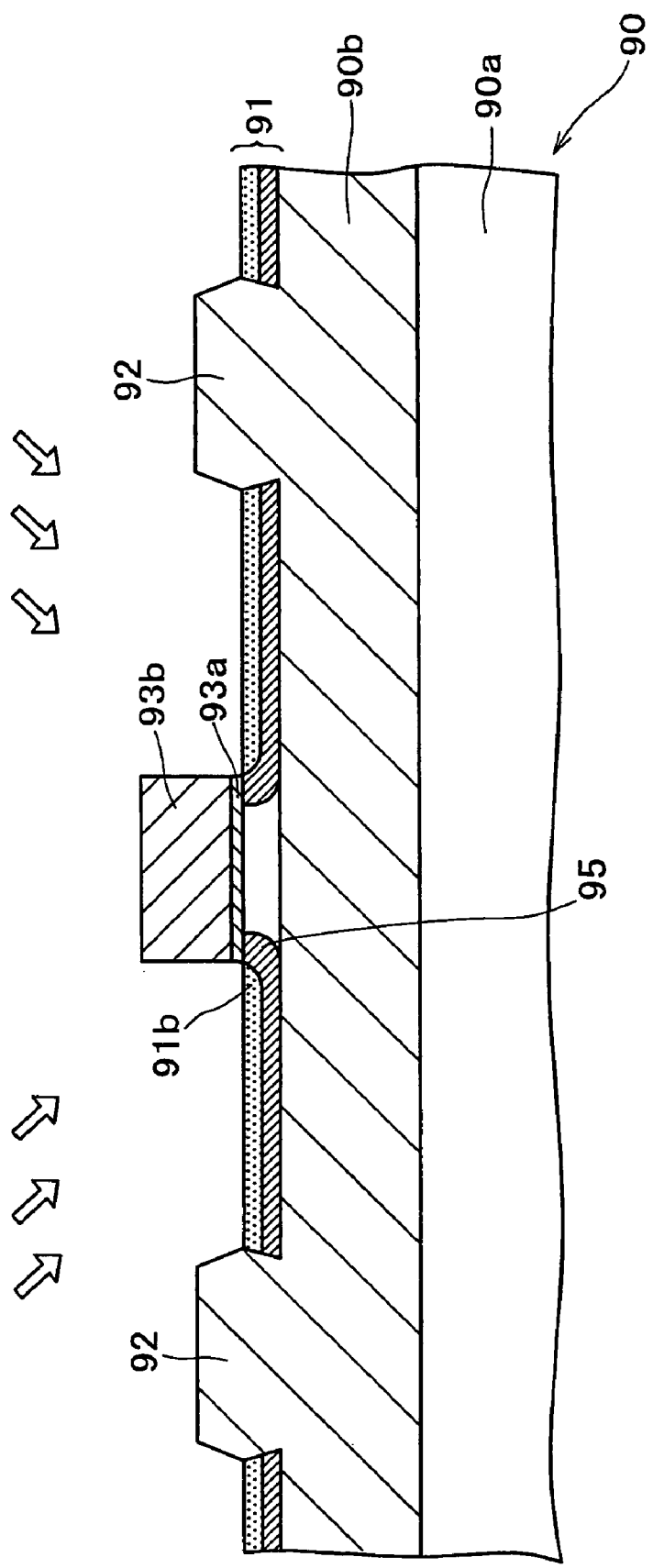
FIG. 10 is a general sectional view of a fully depleted SOI-MOSFET in which a reverse-characteristic layer is formed.

From the results shown in FIG. 7, it is seen that the sheet resistance of the extension portions is lowered as the halo implantation energy is raised. In addition, from the results shown in FIG. 8, it is confirmed that, by conducting the halo implantation so that the range of projection reaches the inside of the buried oxide film, a sufficient threshold voltage can be secured even when the gate length is small, and good roll-off characteristic can be obtained.

As has been described above, according to the present embodiment, by forming the reverse-characteristic layer through adjusting the implantation energy and the implantation angle so that the range of projection in the halo implantation reaches the inside of the buried oxide film in the SOI substrate, it is ensured that the reverse-characteristic layer is formed on the body portion side of the extension portions in the Si active layer region, so that the roll-off characteristic can be improved. In addition, since the reverse-characteristic layer is scarcely formed at the extension portions, the rise of the sheet resistance in the extension portions can be suppressed.

While the present invention has been described in detail above only as to the described embodiment, it is apparent to those skilled in the art that a variety of modifications and corrections are possible within the technical thought of the invention, and it is natural that such modifications and corrections belong to the scope of the appended claims.

For example, while the implantation angle in the halo implantation has been set at 28° in the present embodiment, it suffices for the angle to be so set that the implanted impurity is implanted on the body portion side of the extension portions in the Si active layer region without being interfered by the device separation regions adjacent to the implanted surface (in the example, the surface of the Si active layer region), the gate electrode or the like.

Besides, while the full-silicide structure comprising $CoSi_2$ has been shown in the silicide film, the material and structure for the gate electrode and the silicide film are not limited to those described above. Further, the materials for the SOI substrate (the Si substrate, the buried oxide film, and the SOI layer), the gate insulation film, the gate electrode, the extension portions, the source/drain layer and the like are not limited to those described in the above embodiment, and the same functions or effects as those of the above embodiment can be obtained also when the various materials described in the paragraph of "Summary of the Invention" are applied.

While a preferred embodiment of the present invention has been described using specific terms, such description is for illustrative purposes only, and it is to be understood that changes and variations may be made without departing from the spirit or scope of the following claims.

What is claimed is:

1. A method of manufacturing a semiconductor device, including an SOI layer secured to a Si substrate with a buried oxide film therebetween, forming a plurality of device separation regions in said SOI layer, and implanting an impurity into a Si active layer region between said device separation regions to form a body portion and source/drain portions so as thereby to constitute a MOSFET, said method comprising the steps of:

forming a gate electrode over said body portion of said Si active layer region with a gate insulation film therebetween, implanting an impurity into said Si active layer region to form extension portions of said source/drain portions, and halo-implanting an impurity opposite in polarity from said impurity in said source/drain regions into said Si active layer region to form a reverse-characteristic layer, wherein the range of projection of said halo implantation is set to reach inside of said buried oxide film, wherein said Si active layer region is so formed that a depleted layer induced in said body portion reaches the interface between said SOI layer and said buried oxide film in said SOI substrate, wherein the gate insulation is $SiO_2$ and the gate electrode is a metal sillicide.

2. A method of manufacturing a semiconductor device as set forth in claim 1, wherein the halo implantation angle relative to the direction of a normal to the surface of said Si active layer region is grater that 7°.

* * * * *